(12) United States Patent
Duriez et al.

(10) Patent No.: US 10,269,944 B2
(45) Date of Patent: Apr. 23, 2019

(54) FIN SEMICONDUCTOR DEVICE AND METHOD OF MANUFACTURE WITH SOURCE/DRAIN REGIONS HAVING OPPOSITE CONDUCTIVITIES

(71) Applicant: Taiwan Semiconductor Manufacturing Company, Ltd., Hsinchu (TW)

(72) Inventors: Blandine Duriez, Brussels (BE); Aryan Afzalian, Chastre (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 7 days.

(21) Appl. No.: 15/620,162

(22) Filed: Jun. 12, 2017

(65) Prior Publication Data

US 2017/0278946 A1    Sep. 28, 2017

Related U.S. Application Data

(62) Division of application No. 14/755,156, filed on Jun. 30, 2015, now Pat. No. 9,685,528.

(51) Int. Cl.
*H01L 29/78* (2006.01)
*H01L 29/739* (2006.01)
(Continued)

(52) U.S. Cl.
CPC ........ *H01L 29/7391* (2013.01); *H01L 21/266* (2013.01); *H01L 21/30604* (2013.01);
(Continued)

(58) Field of Classification Search
CPC ................ H01L 29/66795–29/66818; H01L 29/7391–29/7392;
(Continued)

(56) References Cited

U.S. PATENT DOCUMENTS 5,365,083 A   11/1994 Tada
7,683,437 B2 *  3/2010 Mikasa ............ H01L 27/10876
                                              257/401
(Continued)

FOREIGN PATENT DOCUMENTS

CN    103022124 A    4/2013
CN    103383965 A   11/2013
(Continued)

OTHER PUBLICATIONS

Alper, C., et al., "Two Dimensional Quantum Mechanical Simulation of Low Dimensional Tunneling Devices," IEEE Transactions on Electron Devices, vol. 61, No. 3, Mar. 2014, pp. 186-189.

*Primary Examiner* — Eric A. Ward
(74) *Attorney, Agent, or Firm* — Slater Matsil, LLP

(57) ABSTRACT

A semiconductor device and method of manufacturing a semiconductor device using a semiconductor fin is provided. In an embodiment the fin is formed from a substrate, a middle section of the fin is covered, and then portions of the fin on either side of the middle section are removed. A series of implants is then performed and a gate dielectric and a gate electrode are formed to form a tunneling field effect transistor from the fin.

20 Claims, 17 Drawing Sheets

(51) Int. Cl.
  *H01L 29/66* (2006.01)
  *H01L 29/20* (2006.01)
  *H01L 21/266* (2006.01)
  *H01L 21/306* (2006.01)
  *H01L 21/265* (2006.01)

(52) U.S. Cl.
  CPC ........ *H01L 29/20* (2013.01); *H01L 29/66356* (2013.01); *H01L 29/66545* (2013.01); *H01L 29/66795* (2013.01); *H01L 29/785* (2013.01); *H01L 21/26506* (2013.01); *H01L 21/26513* (2013.01); *H01L 21/26586* (2013.01)

(58) Field of Classification Search
  CPC ...... H01L 29/785–29/7856; H01L 21/823431; H01L 21/823821
  See application file for complete search history.

(56) References Cited

U.S. PATENT DOCUMENTS

| | | | |
|---|---|---|---|
| 7,732,282 B2 | 6/2010 | Le Royer et al. | |
| 7,964,465 B2* | 6/2011 | Anderson | H01L 29/66795 257/E21.431 |
| 7,982,269 B2* | 7/2011 | Anderson | H01L 29/66795 257/315 |
| 8,178,400 B2 | 5/2012 | Chang et al. | |
| 8,576,614 B2 | 11/2013 | Heyns et al. | |
| 9,087,720 B1 | 6/2015 | Wu et al. | |
| 2005/0035415 A1* | 2/2005 | Yeo | H01L 29/66795 257/401 |
| 2005/0051825 A1* | 3/2005 | Fujiwara | H01L 29/41733 257/308 |
| 2007/0148837 A1* | 6/2007 | Shah | H01L 21/0332 438/164 |
| 2009/0309162 A1* | 12/2009 | Baumgartner | H01L 29/66818 257/368 |
| 2011/0241103 A1 | 10/2011 | Curatola et al. | |
| 2012/0223390 A1 | 9/2012 | Liang et al. | |
| 2013/0075811 A1* | 3/2013 | Wang | H01L 29/66795 257/329 |
| 2013/0140612 A1 | 6/2013 | Sun et al. | |
| 2013/0214357 A1* | 8/2013 | Chang | H01L 29/66545 257/347 |
| 2014/0203334 A1 | 7/2014 | Colinge et al. | |
| 2015/0179800 A1 | 6/2015 | Biswas et al. | |
| 2015/0340488 A1 | 11/2015 | Leobandung et al. | |
| 2016/0043234 A1 | 2/2016 | Alper et al. | |
| 2016/0099343 A1* | 4/2016 | Pawlak | H01L 29/66977 257/12 |

FOREIGN PATENT DOCUMENTS

| | | |
|---|---|---|
| EP | 2568506 A1 | 3/2013 |
| TW | 201431087 A | 8/2014 |

* cited by examiner

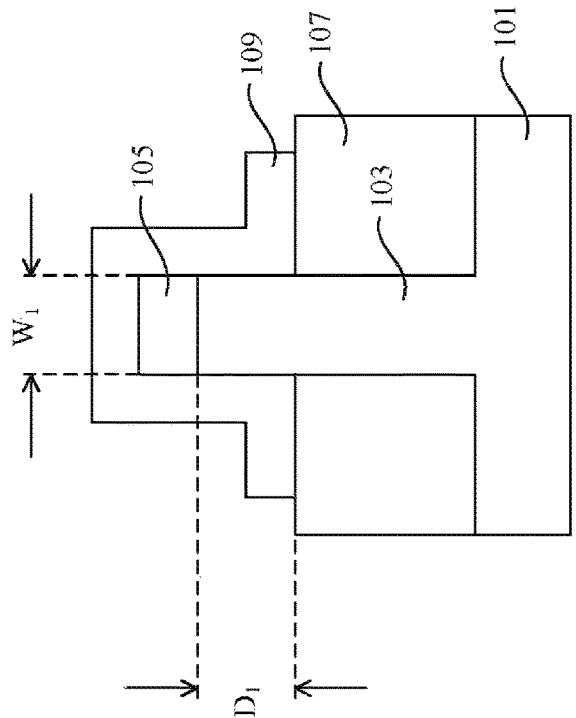
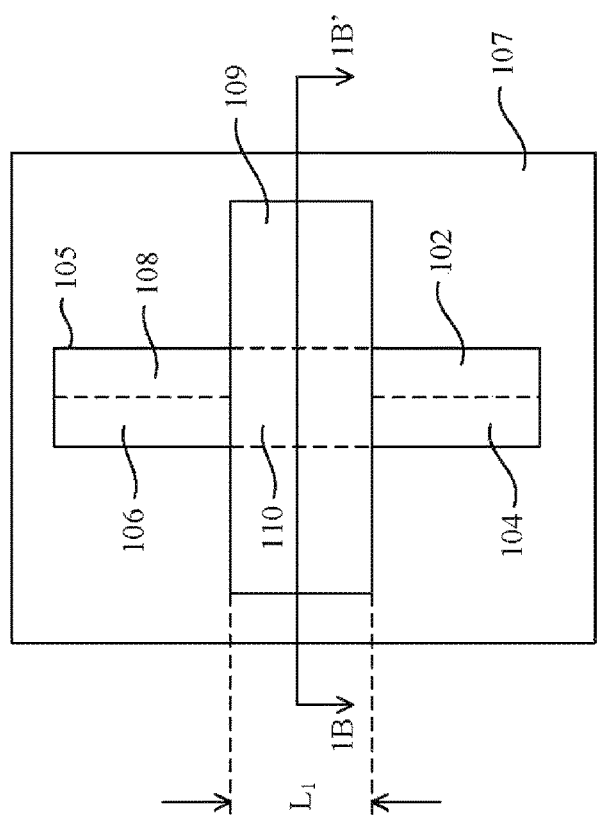
Figure 1B
Figure 1A

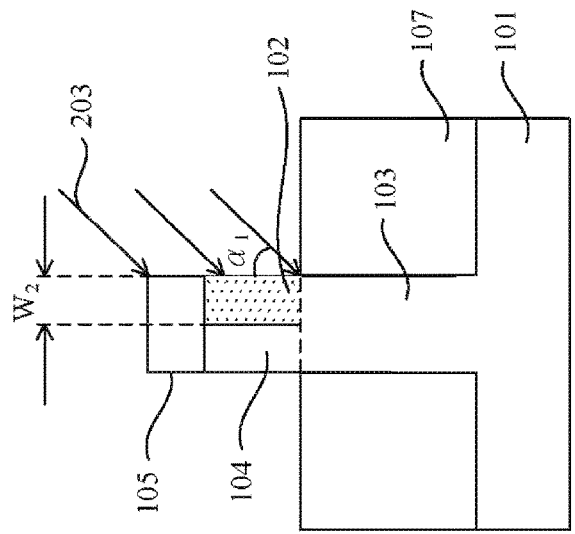
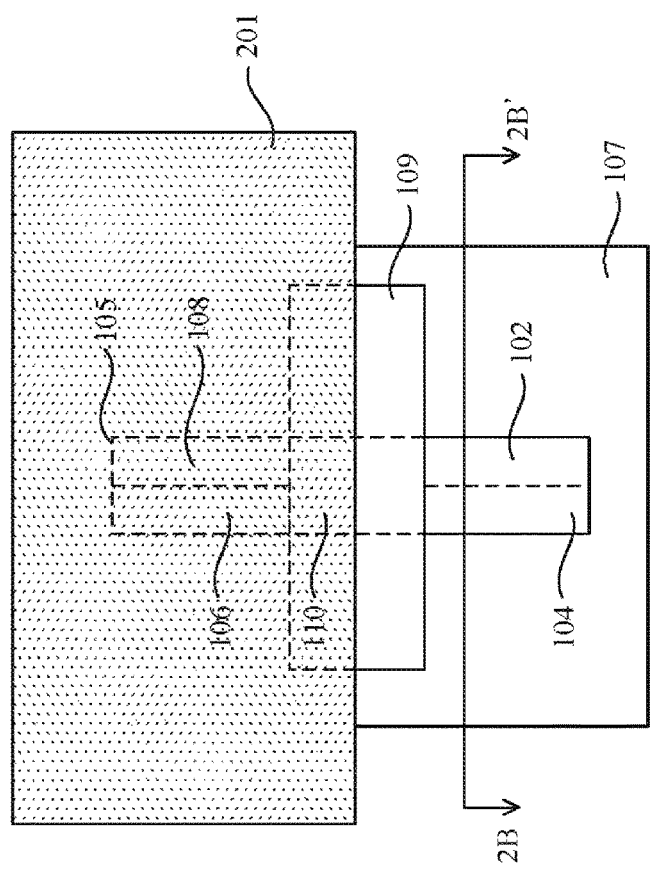
Figure 2A
Figure 2B

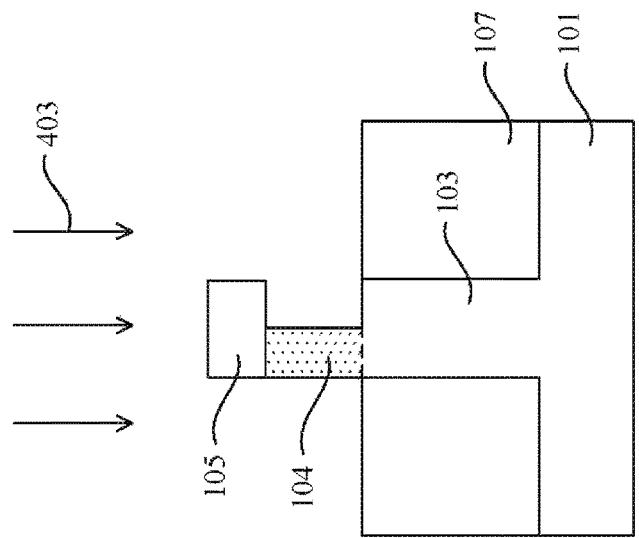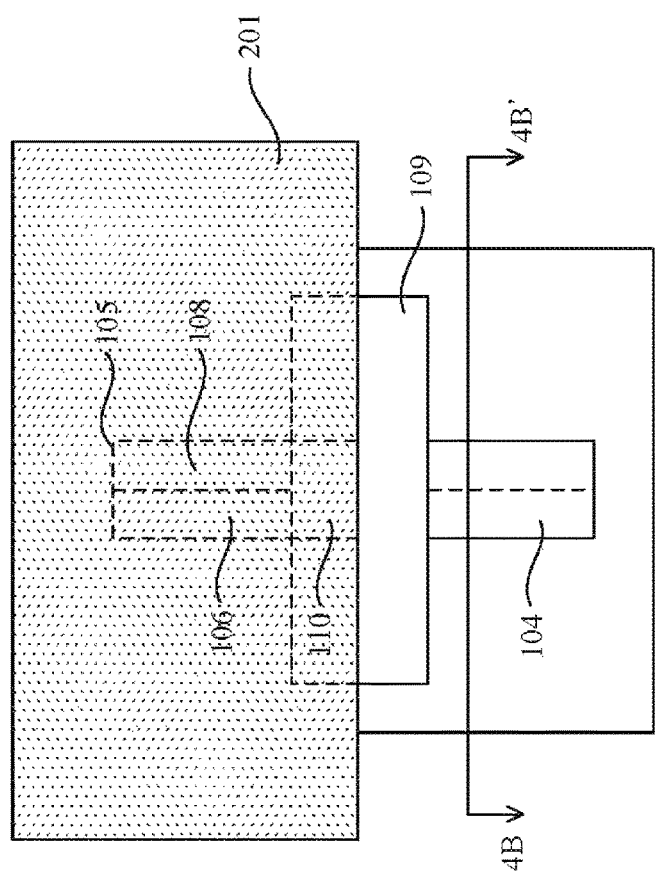
Figure 4B
Figure 4A

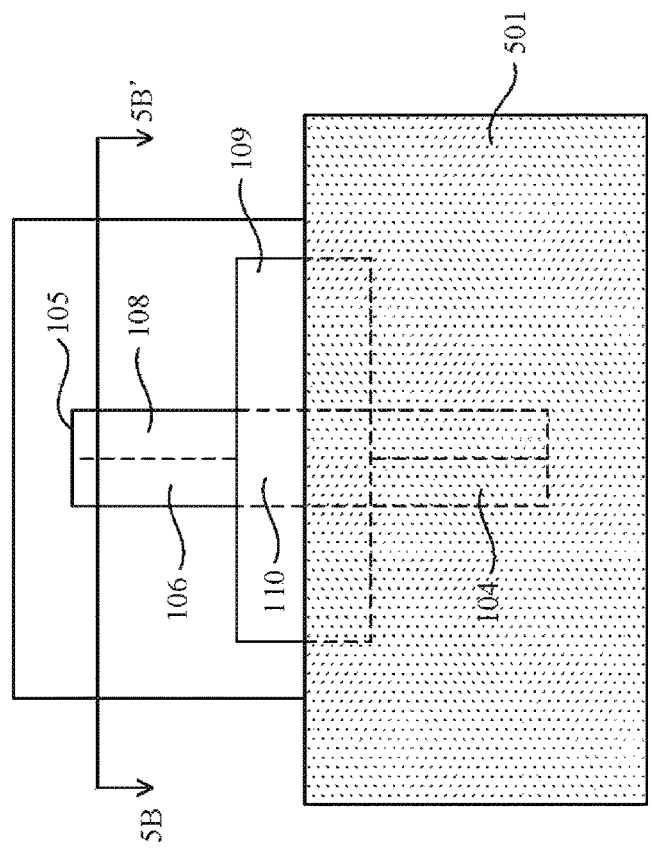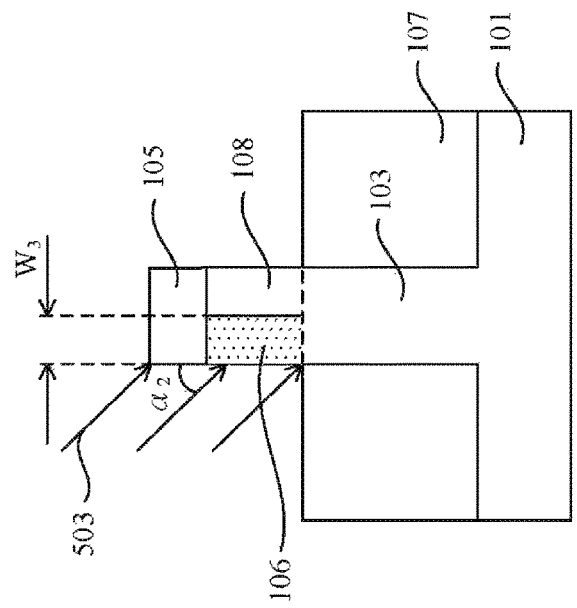
Figure 5A
Figure 5B

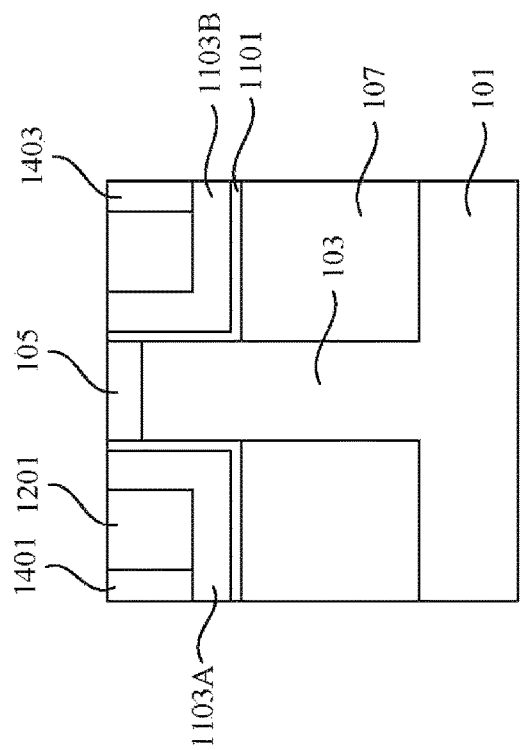
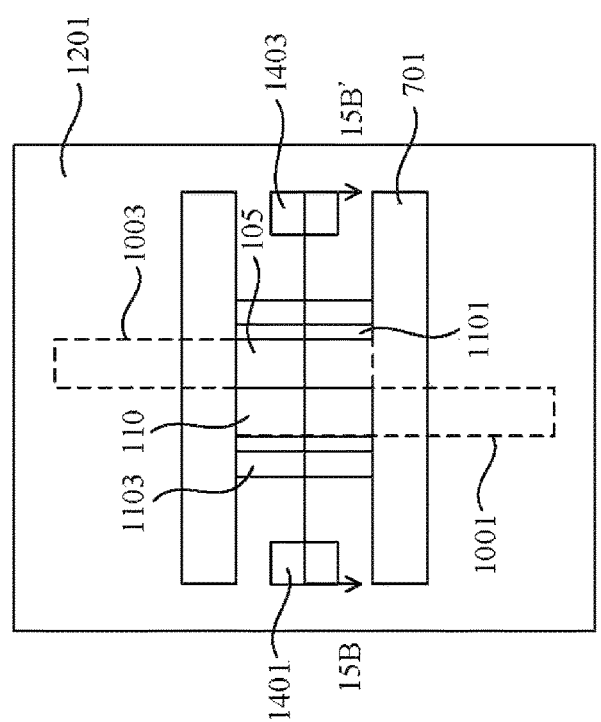
Figure 15B
Figure 15A

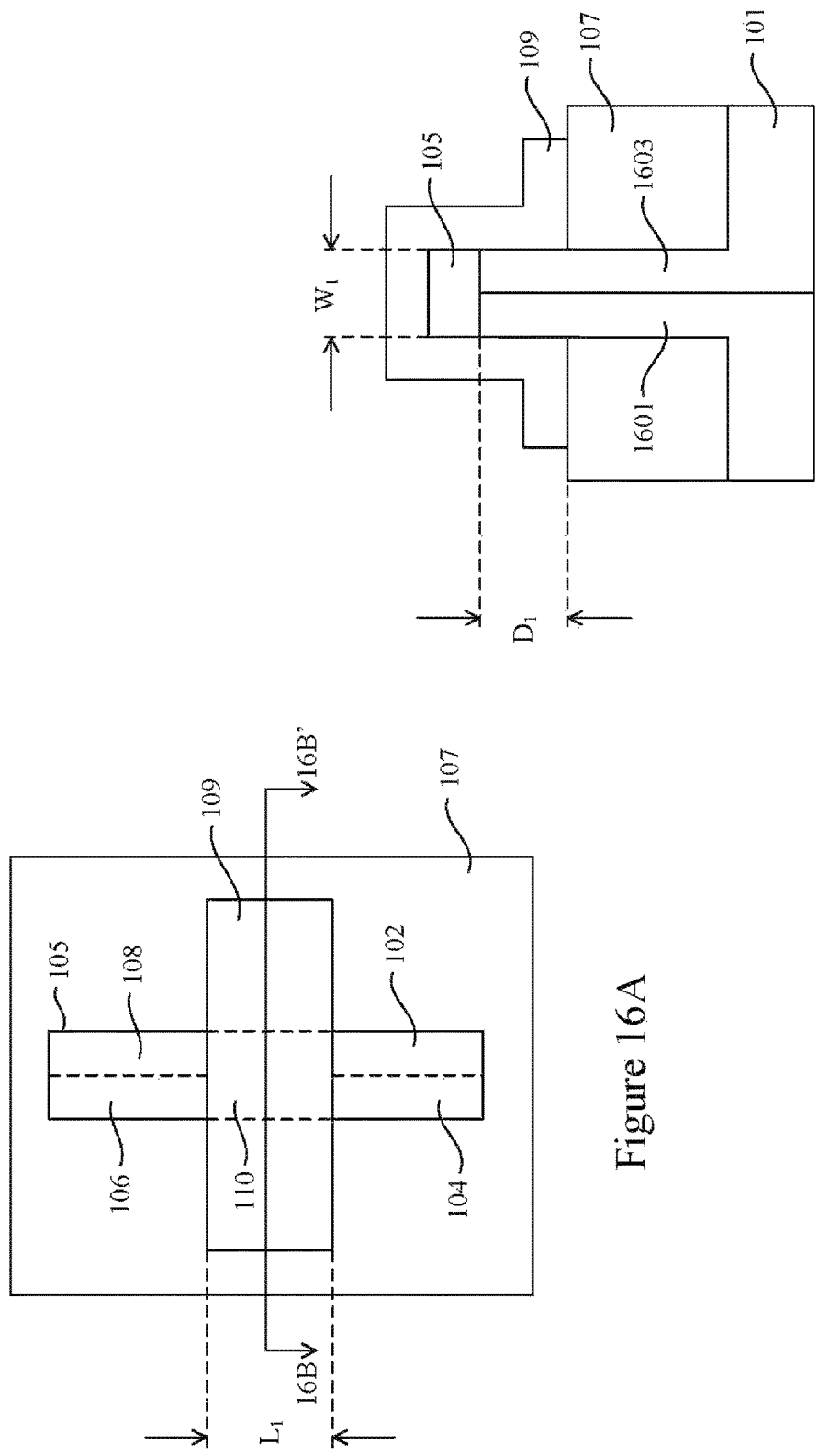

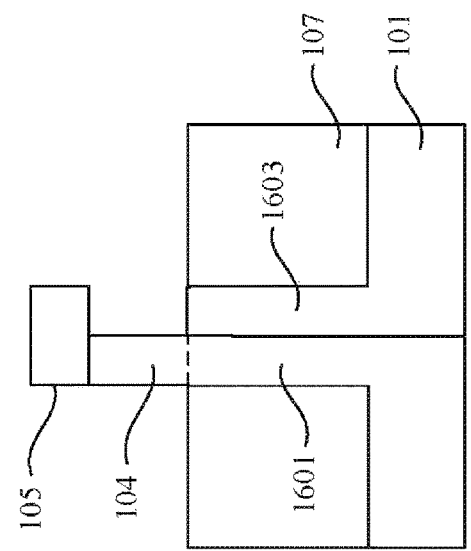
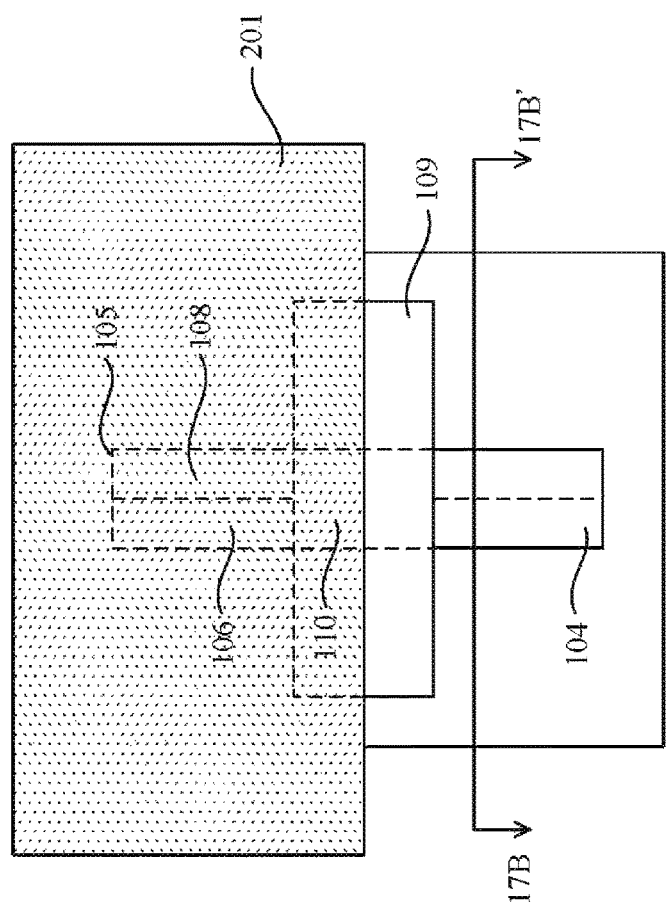
Figure 17A
Figure 17B

FIN SEMICONDUCTOR DEVICE AND METHOD OF MANUFACTURE WITH SOURCE/DRAIN REGIONS HAVING OPPOSITE CONDUCTIVITIES

PRIORITY CLAIM AND CROSS-REFERENCE

This application is a divisional of U.S. patent application Ser. No. 14/755,156, entitled "FIN SEMICONDUCTOR DEVICE AND METHOD OF MANUFACTURE WITH SOURCE/DRAIN REGIONS HAVING OPPOSITE CONDUCTIVITIES," filed on Jun. 30, 2015, which application is incorporated herein by reference.

BACKGROUND

Metal-oxide-semiconductor (MOS) devices are key components of integrated circuits. A MOS device can work in three regions, depending on gate voltage $V_g$ and source-drain voltage $V_{ds}$, linear, saturation, and sub-threshold regions. The sub-threshold region is a region where $V_g$ is smaller than the threshold voltage $V_t$. A parameter known as Sub-threshold Swing (SS) represents the easiness of switching the transistor current off and thus is an important factor in determining the speed of a MOS device. The sub-threshold swing can be expressed as a function of $m*kT/q$, where m is a parameter related to capacitance. The sub-threshold swing of a typical MOS device has a limit of about 60 mV/decade (kT/q) at room temperature, which in turn sets a limit for further scaling of operation voltage VDD and threshold voltage $V_t$. This limitation is due to the diffusion transport mechanism of carriers. For this reason, existing MOS devices typically cannot switch faster than 60 mV/decade at room temperatures. The 60 mV/decade sub-threshold swing limit also applies to FinFETs or ultra thin-body MOSFETs on silicon-on-insulator (SOI) devices. However, even with better gate control over the channel, an ultra thin body MOSFET on SOI or a FinFET can only achieve close to, but not below, the limit of 60 mV/decade. With such a limit, faster switching at low operation voltages for future nanometer devices cannot be achieved.

To solve the above-discussed problem, Tunnel Field Effect Transistors (TFETs) have been explored. TFETs can improve both of these parameters by changing the carrier injection mechanism. In a MOSFET, the SS is limited by the diffusion of carriers over the source-to-channel barrier where the injection current is proportional to kT/q. Hence at room temperature, the SS is 60 mV/dec. In a TFET, injection is governed by the band-to-band tunneling from the valence band of the source to the conduction band of the channel. Accordingly, much lower sub-threshold swing can be achieved. Since the TFETs are often designed to have a p-i-n diode configuration, much lower leakage currents are achieved. Also, the TFETs are more resistant to short-channel effects commonly seen on MOSFETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1B illustrate a fin formed from a substrate in accordance with some embodiments.

FIGS. 2A-2B illustrate a first implantation process in accordance with some embodiments.

FIGS. 4A-4B illustrate a second implantation process in accordance with some embodiments.

FIGS. 5A-5B illustrate a third implantation process in accordance with some embodiments.

FIGS. 15A-15B illustrate an implantation free middle section of the fin in accordance with some embodiments.

FIGS. 16A-16B illustrate a first material and a second material in the fin in accordance with some embodiments.

FIGS. 17A-17B illustrate a removal of the first section in accordance with some embodiments.

DETAILED DESCRIPTION

Figure 3B:
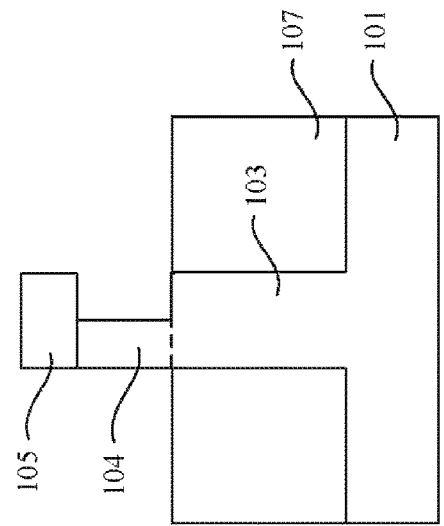
FIGS. 3A-3B illustrate a removal of a first section of the fin in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIGS. 1A-1B, wherein FIG. 1B is a cross-sectional view of FIG. 1A through line 1B-1B', there is illustrated a semiconductor substrate 101 formed into a fin 103. In an embodiment the semiconductor substrate 101 may comprise, for example, a III-V material (such as gallium arsenide, indium arsenide, or the like), bulk silicon, doped or undoped, germanium, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The fin 103 may be formed from the semiconductor substrate 101. In an embodiment the fin 103 may be formed from the semiconductor substrate 101 by initially forming a patterned mask 105 over the semiconductor substrate 101. The patterned mask 105 may comprise a hard mask of one or more dielectric layers. For example, the hard mask may be a layer of a silicon dioxide or a silicon nitride formed by, for example, thermal oxidation, chemical vapor deposition (CVD), or the like. Alternatively, the hard mask may be formed of other dielectric materials, such as silicon oxynitride. A multi-layer hard mask, such as layers of silicon dioxide and silicon nitride, may also be used. Furthermore, other materials, such as a metal, a metal nitride, a metal oxide, or the like may be used. For example, the hard mask may be formed of tungsten.

The patterned mask 105 is subsequently patterned using, for example, photolithography techniques. Generally, photolithography techniques involve depositing a photoresist material and irradiating the photoresist material in accordance with a pattern. Thereafter, the photoresist material is developed to remove a portion of the photoresist material. The remaining photoresist material protects the underlying material during subsequent processing steps, such as etching. In this case, the photoresist material is utilized to create the patterned mask 105 to define the fin 103. As such, the patterned mask 105 may be formed to have a first width $W_1$ of between about 5 nm and about 100 nm, such as about 10 nm.

Once the patterned mask 105 has been formed, the fin 103 may be formed using a subtractive etching process along with the patterned mask 105. For example, exposed portions of the semiconductor substrate 101 may be etched to form the fin 103 from the semiconductor substrate 101. In an embodiment the semiconductor substrate 101 may be etched by, for example, $HBr/O_2$, $HBr/Cl_2/O_2$, or $SF_6/C_{12}$ plasma. In an embodiment the fin 103 may be patterned such that it will eventually be used for a channel in a semiconductor device such as a tunneling field effect transistor (TFET).

However, as one of ordinary skill in the art will recognize, the subtractive process described above to form the fin 103 is intended to be illustrative and is not intended to limit the embodiments. Rather, any suitable process, such as an epitaxial growth process using the semiconductor substrate 101 and a mask, may alternatively be utilized to form the fin 103. Any suitable process for forming the fin 103 from the semiconductor substrate 101 may alternatively be utilized, and all such processes are fully intended to be included within the scope of the embodiments.

FIGS. 1A-1B also illustrate a formation of isolation regions 107 on opposing sides of the fin 103. In an embodiment, the isolation regions 107 may be a dielectric material such as an oxide material, a high-density plasma (HDP) oxide, or the like. The dielectric material may be formed using either a chemical vapor deposition (CVD) method (e.g., the HARP process), a high density plasma CVD method, or other suitable method of formation as is known in the art.

The region around the fin 103 may be filled by overfilling the regions around the fin 103 with the dielectric material and then removing the excess material from over the fin 103 through a suitable process such as chemical mechanical polishing (CMP), an etch, a combination of these, or the like. Once the regions around the fin 103 have been filled with the dielectric material, the dielectric material may then be recessed away from the top surface of the fin 103. The recessing may be performed to expose at least a portion of the sidewalls of the fin 103. The dielectric material may be recessed using a wet etch by dipping the top surface of the fin 103 and the dielectric material into an etchant such as HF, although other etchants, such as $H_2$, and other methods, such as a reactive ion etch, a dry etch with etchants such as $NH_3/NF_3$, chemical oxide removal, or dry chemical clean may alternatively be used. The dielectric material may be recessed to a first depth $D_1$ from a top surface of the fin 103 of between about 5 nm and about 300 nm, such as about 40 nm.

As one of ordinary skill in the art will recognize, however, the steps described above may be only part of the overall process flow used to fill and recess the dielectric material to form the isolation regions 107. For example, lining steps, cleaning steps, annealing steps, gap filling steps, combinations of these, and the like may also be utilized to form the isolation regions 107. All of the potential process steps are fully intended to be included within the scope of the present embodiment.

Once the isolation regions 107 have been formed, a first dummy gate material 109 may be formed over the fin 103. The first dummy gate material 109 may comprise a material, such as a doped or undoped poly-crystalline silicon (or amorphous silicon), a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), other conductive materials, combinations thereof, or the like. In an embodiment in which the first dummy gate material 109 is polysilicon, the first dummy gate material 109 may be formed by depositing doped or undoped polysilicon by low-pressure chemical vapor deposition (LPCVD) to a thickness in the range of about 400 Å to about 2,400 Å, such as about 1,400 Å.

Once the first dummy gate material 109 has been formed, the first dummy gate material 109 may be patterned into a shape that will eventually be utilized to define a gate electrode 1103 (not illustrated in FIGS. 1A-1B but illustrated and discussed below with respect to FIG. 11). In an embodiment the first dummy gate material 109 may be patterned to have a first length $L_1$ of between about 5 nm and about 1 µm, such as about 150 nm. The first dummy gate material 109 may be patterned using, e.g., a photolithographic process whereby a photoresist is applied, irradiated, and developed to form a mask, and the mask is then utilized to remove exposed portions of the first dummy gate material 109.

With the first dummy gate material 109 formed over the fin, the fin 103 may comprise five distinct sections (located in FIG. 1A beneath the patterned mask 105 but illustrated using dashed lines for convenience). The first section is a middle section 110 of the fin 103 that is located beneath the first dummy gate material 109. On one side of the middle section 110, the fin 103 may comprise at its corners regions a first section 102 and a second section 104 adjacent to the first section 102. On an opposing side of the middle section 110 the fin 103 may comprise at its corner regions a third section 106, which shares a side of the fin 103 with the middle section 110 and the second section 104, and a fourth section 108, which shares an opposite side of the fin 103 with the middle section 110 and the first section 102.

FIGS. 2A-2B (wherein FIG. 2B is cross-section view of FIG. 2A along line 2B-2B') illustrate a formation of a first implantation mask 201 and a first implantation (represented in FIGS. 2A-2B by the arrows labeled 203) into the first section 102 of the fin 103. In an embodiment the first implantation mask 201 is placed and patterned in order to cover at least a portion of the first dummy gate material 109 as well as completely cover the third section 106 of the fin 103 and the fourth section 108 of the fin 103. In an embodiment the first implantation mask 201 may be a photoresist that is first applied and then patterned to cover the first dummy gate material 109 as well the third section 106 and the fourth section 108 while leaving the first section 102 of the fin 103 and the second section 104 of the fin 103 exposed. The patterning may be performed by exposing the photoresist to a patterned energy source (e.g., light) to induce a chemical reaction in those portions of the photoresist exposed to the energy, and then developing the photoresist to remove the undesired portions of the photoresist to form the first implantation mask 201.

Alternatively, the first implantation mask 201 may be a hard mask made of a dielectric material such as silicon nitride. In this embodiment the dielectric material may be initially deposited using a deposition process such as chemical vapor deposition, physical vapor deposition, or the like. Once the dielectric material has been deposited, a photolithographic masking and etching process may be performed, whereby a photoresist is placed over the dielectric material, exposed to the patterned energy source, and developed. The patterned photoresist is then used as a mask along with an etching process (such as a reactive ion etch) to transfer the pattern of the photoresist to the dielectric material.

Once the first implantation mask 201 has been formed to cover a portion of the first dummy gate material 109 as well the third section 106 and the fourth section 108, the first implantation is performed in order to implant first dopants into the first section 102 of the fin 103. In an embodiment the first dopants are amorphizing species that will work to amorphize the first section 102 of the fin 103, and may be, e.g., argon, krypton, xenon, indium, arsenic, germanium, combinations of these, or the like.

In an embodiment the first dopants may be implanted into the first section 102 using a process such as a first implantation process, whereby ions of the desired first dopants are accelerated and directed towards the first section 102 of the fin 103. The ion implantation process may utilize an accelerator system to accelerate ions of the desired first dopant. As such, while the precise energy utilized will depend at least in part on the fin height and the species used, in one embodiment the accelerator system may use an energy of from about 0.5 KeV to about 30 KeV, such as about 2 KeV. Additionally, in order to implant the first dopants into the first section 102 within the fin 103 and not to implant the first dopants throughout the first section 102 and the second section 104, the first dopants are implanted at, e.g., a first angle $\alpha_1$ of between about 1° and about 90°, such as about 45°, from perpendicular to the semiconductor substrate 101.

By implanting the first dopants into the first section 102 of the fin 103, the first section 102 of the fin 103 with the first dopants may have a second width $W_2$ within the fin 103 of between about 2 nm and about 50 nm, such as about 5 nm. Additionally, the first dopants may be implanted to a concentration of between about 1e13 $cm^{-3}$ to about 1e19 $cm^{-3}$, such as about 1e15 $cm^{-3}$. However any suitable dimensions and concentration may alternatively be utilized.

Figure 3A:
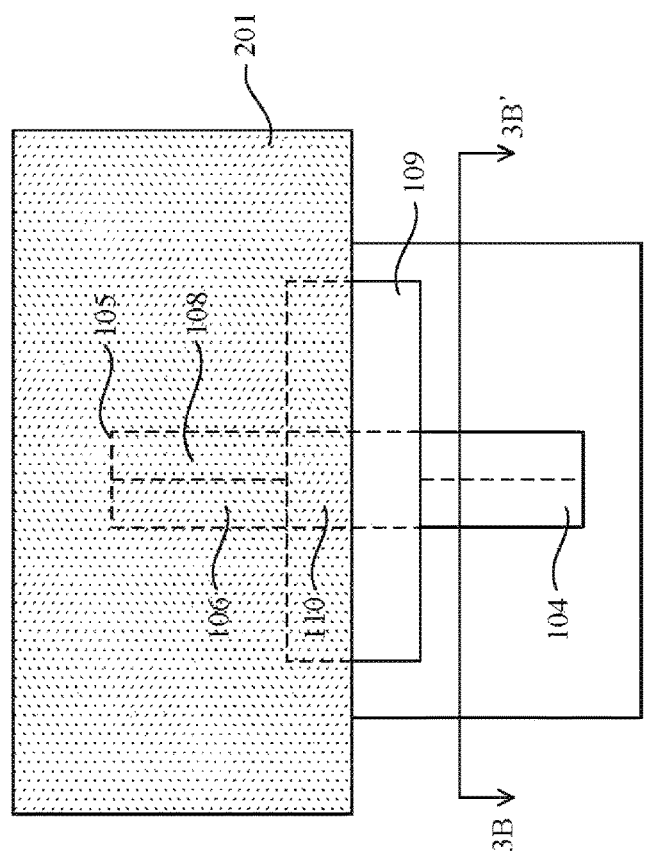

FIGS. 3A-3B (with FIG. 3B being a cross-sectional view of FIG. 3A along line 3A-3A') illustrate a removal of the first section 102 from the fin 103. In an embodiment the first section 102 may be removed using, e.g., a wet etch process that utilizes an etchant that selectively removes the material of the first section 102 (e.g., the material of the fin 103 that has been amorphized by the first dopants) without significantly removing the material of the fin 103 outside of the first section 102 (e.g., the second section 104). As such, while the precise etchant utilized is dependent at least in part upon the materials used for the fin 103 and the first dopants, in an embodiment in which the fin 103 comprises silicon and the first dopants are germanium, an etchant such as HF may be used to remove the first section 102. However, any suitable etchant or method may alternatively be utilized.

FIGS. 4A-4B illustrate that, once the first section 102 has been removed, the second section 104 may be formed into part of a first source/drain region 1001 (not fully formed or illustrated in FIGS. 4A-4B, but illustrated as fully formed below with respect to FIGS. 10A-10B). In an embodiment the second section 104 may be implanted with the second dopants using a second implantation process (represented in FIG. 4B by the arrows labeled 403) that works to implant second dopants, such as either n-type dopants such as phosphorous, arsenic, or antimony or p-type dopants such as boron, gallium, or indium, depending on the desired device to be formed. The second implantation process 403 may utilize an accelerator system to accelerate ions of the desired second dopant with an energy of from about 0.5 KeV to about 30 KeV, such as about 2 KeV. Additionally, because the second section 104 may be fully doped, the second dopants may be implanted at any desired angle, such as perpendicular to the semiconductor substrate 101. The second dopants may be implanted to a concentration of between about 1e13 $cm^{-3}$ to about 1e21 $cm^{-3}$, such as about 1e19 $cm^3$, although any suitable concentration may alternatively be utilized.

FIGS. 5A-5B (with FIG. 5B being a cross-sectional view of FIG. 5A along line 5A-5A') illustrate a removal of the first implantation mask 201 and a placement of a second implantation mask 501 over at least a portion of the first dummy gate material 109 and the second section 104 of the fin 103. In an embodiment in which the first implantation mask 201 is a photoresist, the first implantation mask 201 may be removed using, e.g., an ashing process, whereby the temperature of the first implantation mask 201 is increased to a point where the first implantation mask 201 will undergo a thermal decomposition and is then easily removed. However, any other suitable removal process, such as a wet etch, may alternatively be used to strip the first implantation mask 201.

Once the first implantation mask 201 has been removed, the second implantation mask 501 may be placed over the portion of the first dummy gate material 109 and completely covering the second section 104 of the fin 103 while leaving the third section 106 of the fin 103 and the fourth section 108 of the fin 103 exposed by the second implantation mask 501 for further processing. In an embodiment the second implantation mask 501 may be similar to the first implantation mask 201, such as by being a photoresist or a hardmask that has been patterned to cover the portion of the first dummy gate material 109 and the second section 104 of the fin 103. However, any other suitable material or process that may be used to protect the portion of the first dummy gate material 109 and the second region 209 of the fin 103 may alternatively be utilized.

FIGS. 5A-5B also illustrate that, once the second implantation mask 501 has been placed, a third implantation process (represented in FIG. 5B by the arrows labeled 503) may be performed in order to implant third dopants into the third section 106 of the fin 103. In an embodiment the second implantation region 505 is performed in order to implant third dopants which may be amorphizing species that will work to amorphize the fin 103 within the third section 106, and may be, e.g., argon, krypton, xenon, indium, arsenic, germanium, combinations of these, or the like.

In an embodiment the third dopants may be implanted into the third section 106 using a process such as the third implantation process 503, whereby ions of the desired third dopants are accelerated and directed towards the third section 106. The third implantation process 503 may utilize an accelerator system to accelerate ions of the desired third dopants with energy of from about 0.5 KeV to about 30 KeV, such as about 2 KeV. Additionally, in order to implant the third section 106 within the fin 103 and not to implant the third dopants throughout the fourth section 108 of the fin 103, the third dopants are implanted at, e.g., a second angle $\alpha_2$ of between about 1° and about 90°, such as about 45°, from perpendicular to the semiconductor substrate 101.

By implanting the third dopants, the third section 106 may be implanted with a third width $W_3$ within the fin 103 of between about 2 nm and about 50 nm, such as about 5 nm. Additionally, the third dopants may be implanted within the third section 106 to a concentration of between about 1e13 $cm^{-3}$ to about 1e21 $cm^{-3}$, such as about 1e19 $cm^{-3}$. However, any suitable dimensions and any suitable concentration may alternatively be utilized.

Figure 6B:
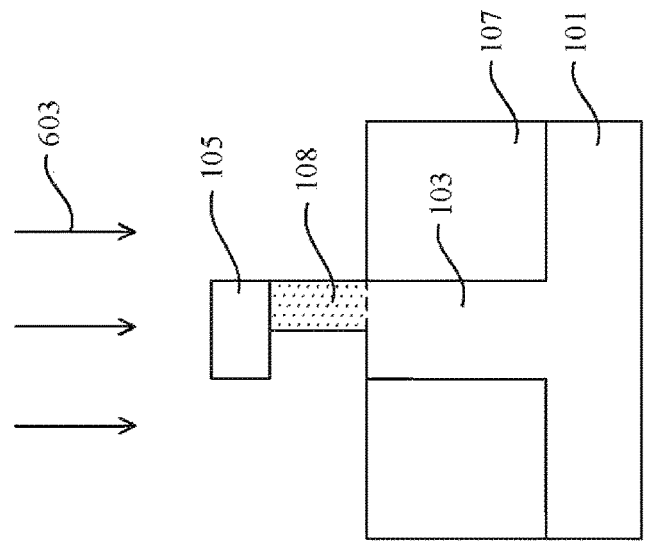
FIGS. 6A-6B illustrate a removal of a third section of the fin and a fourth implantation process in accordance with some embodiments.
Figure 6A:
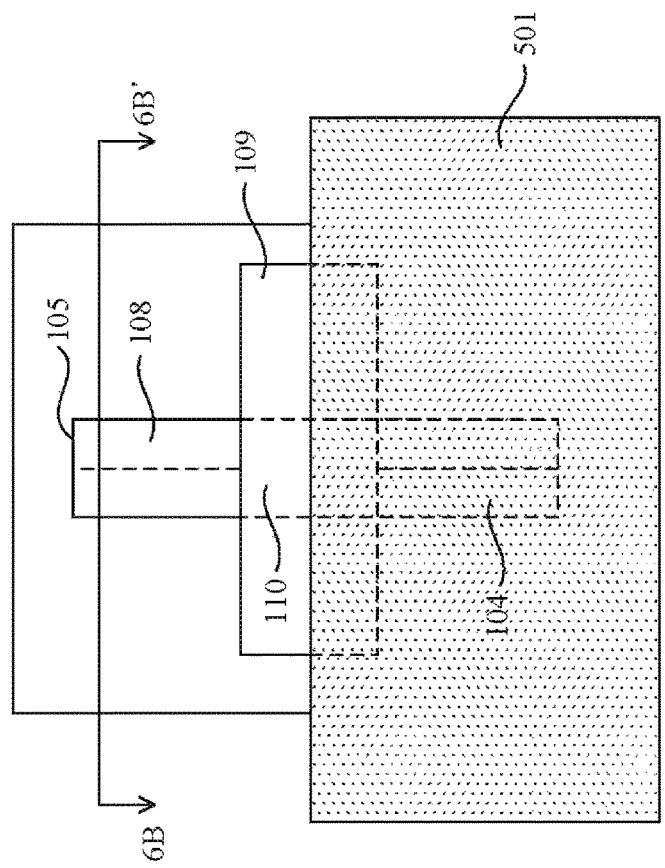

FIGS. 6A-6B (wherein FIG. 6B illustrates a cross-sectional view of FIG. 6A along line 6A-6A') illustrate a removal of the third section 106 from the fin 103. In an embodiment the third section 106 may be removed using a process similar to the process used to remove the first section 102 from the fin 103 (described above with respect to FIGS. 3A-3B). For example, a wet etch process that utilizes an etchant that selectively removes the material of the third section 106 (e.g., the material of the fin 103 that has been amorphized by the third dopants) within significantly removing the material of the fin 103 outside of the third section 106 (e.g., the fourth section 108 of the fin 103). As such, while the precise etchant utilized is dependent at least in part upon the materials used for the fin 103 and the third dopants, in an embodiment in which the fin 103 comprises silicon and the third dopants comprise germanium, an etchant such as HF may be used to remove the third section 106. However, any suitable etchant or method may alternatively be utilized.

FIGS. 6A-6B additionally illustrate that once the third section 108 has been removed, the fourth section 108 of the fin 103 may be formed into part of a second source/drain region 1003 (not fully illustrated in FIGS. 6A-6B, but fully illustrated and described below with respect to FIG. 10). In an embodiment the fourth section 108 may be implanted using a fourth implantation process (represented in FIG. 6B by the arrows labeled 603) that works to implant fourth dopants, such as either n-type dopants such as phosphorous, arsenic, or antimony or p-type dopants such as boron, gallium, or indium that are of an opposite conductivity type than the second dopants (implanted within the second section 104). The fourth implantation process 603 may utilize an accelerator system to accelerate ions of the desired fourth dopant with energy of from about 0.5 KeV to about 30 KeV, such as about 2 KeV. Additionally, because the fourth section 108 of the fin 103 may be fully doped, the fourth dopants may be implanted at any desired angle, such as perpendicular to the semiconductor substrate 101. The fourth dopants may be implanted to a concentration of between about 1e13 $cm^{-3}$ to about 1e21 $cm^{-3}$, such as about 1e19 $cm^{-3}$, although any suitable concentration may alternatively be utilized.

Figure 7:
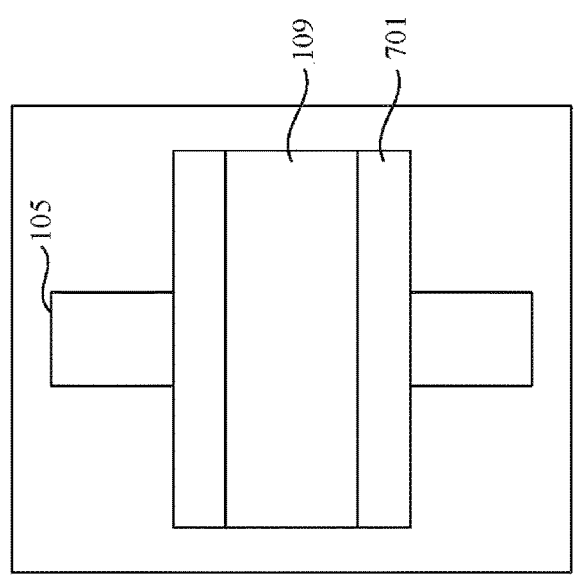
FIG. 7 illustrates formation of spacers in accordance with some embodiments.

FIG. 7 illustrates a removal of the second implantation mask 501 and a formation of spacers 701 on opposite sides of the first dummy gate material 109. In an embodiment in which the second implantation mask 501 is a photoresist, the second implantation mask 501 may be removed using, e.g., an ashing process, whereby the temperature of the second implantation mask 501 is increased to a point where the second implantation mask 501 will undergo a thermal decomposition and is then easily removed. However, any other suitable removal process, such as a wet etch, may alternatively be used to strip the second implantation mask 501.

Once the second implantation mask 501 has been removed, the spacers 701 may be formed. In an embodiment the spacers 701 are formed by blanket depositing a spacer layer (not shown) on the previously formed structure. The spacer layer may comprise SiN, oxynitride, SiC, SiON, oxide, and the like and may be formed by methods utilized to form such a layer, such as chemical vapor deposition (CVD), plasma enhanced CVD, sputter, and other methods known in the art. The spacers 701 may then be patterned, such as by one or more etches to remove the spacer layer from the horizontal surfaces of the structure and from along two edges of the first dummy gate material 109.

Figure 8:
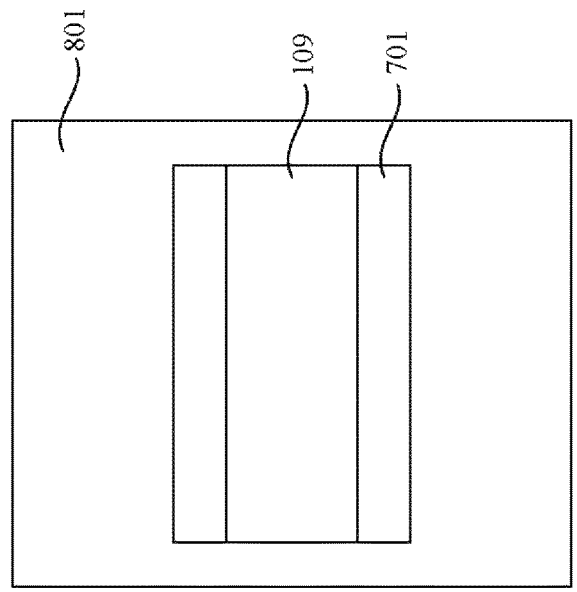
FIG. 8 illustrates formation of a first interlayer dielectric in accordance with some embodiments.

FIG. 8 illustrates a formation of a first ILD 801 over the semiconductor substrate 101 and over the first dummy gate material 109 and the spacers 701. In an embodiment the first ILD 801 may be formed by ALD, PVD, CVD, or other acceptable methods for forming an ILD. The first ILD 801 may comprise doped or undoped silicon oxide, although other materials such as silicon nitride doped silicate glass, high-k materials, combinations of these, or the like, may alternatively be utilized. After formation of the first ILD 801, the first ILD 801, the first dummy gate material 109 and the spacers 701 may be planarized using suitable techniques such as a chemical mechanical polish (CMP) process. The planarization process will re-expose the first dummy gate material 109 as well as the spacers 701 for further processing, while protecting the other underlying structures.

Figure 9B:
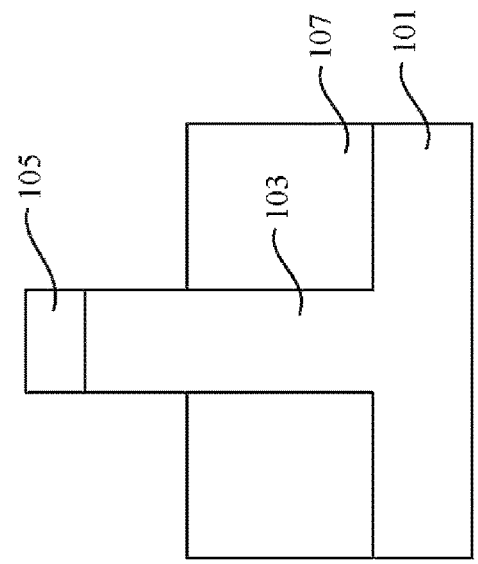
FIGS. 9A-9B illustrate a removal of dummy gate material in accordance with some embodiments.
Figure 9A:
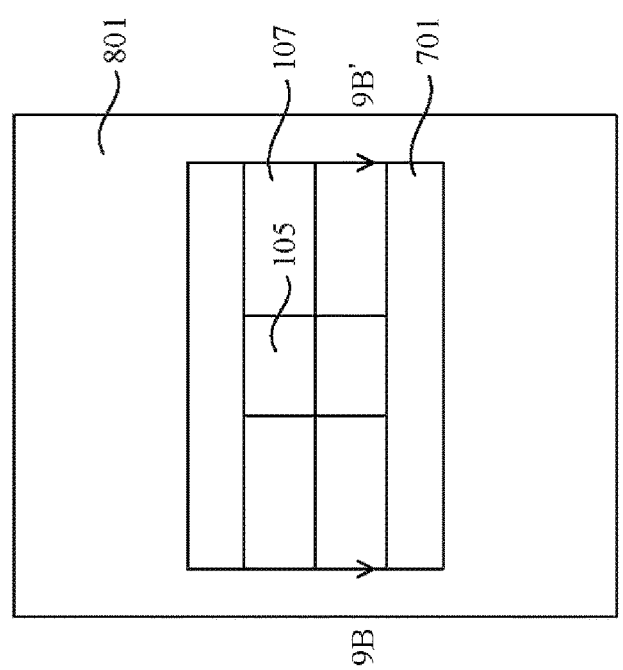

FIGS. 9A-9B (wherein FIG. 9B being a cross-sectional view of FIG. 9A along line 9B-9B') illustrate that, once the first ILD 801, the first dummy gate material 109 and the spacers 701 have been planarized, the first dummy gate material 109 may be removed. In an embodiment the first dummy gate material 109 is removed using a removal process suitable for the material that was chosen to form the first dummy gate material 109. As such, while the precise method of removal will be at least in part dependent upon the material chosen, in an embodiment in which the first dummy gate material 109 is polysilicon, the first dummy gate material 109 may be removed using a process such as plasma etching with an etchant such as $HBr/Cl_2$, $F_2$, or a wet etching such as $NH_4OH$, combinations of these, or the like.

Figure 10A:
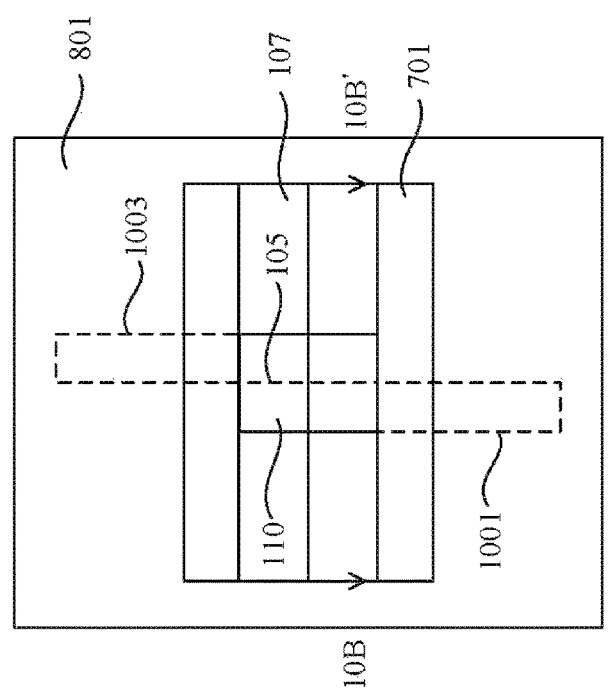
FIGS. 10A-10B illustrate a fifth implantation process and a sixth implantation process in accordance with some embodiments.
Figure 10B:
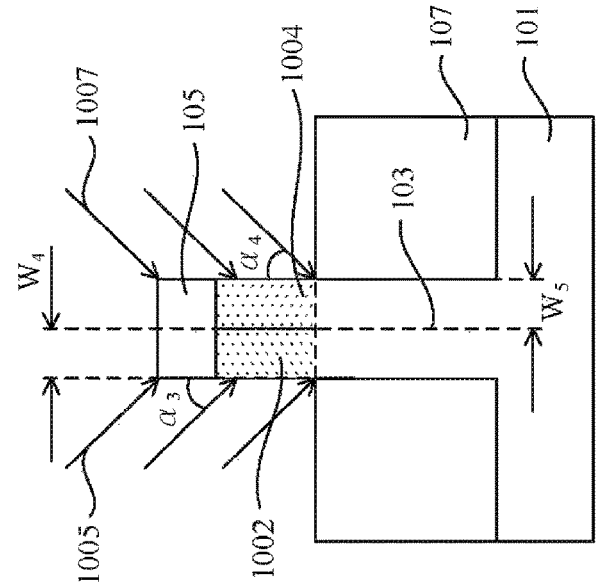

FIGS. 10A-10B (wherein FIG. 10B is a cross-sectional view of FIG. 1A along line 10A-10A') illustrate a formation of a first implantation region 1002 and a second implantation region 1004 within the middle section 110 of the fin 103 that had been previously covered by the first dummy gate material 109. In an embodiment the first implantation region 1002 may be implanted with fifth dopants that are similar to the second dopants that were previously implanted into the second section 104 (see FIGS. 4A-4B for the second implantation process 403). Together, the first implantation region 1002 (within the middle section 110 of the fin 103) and the second section 104 (which also be seen as a first extension region extending away from the first implantation region 1002) form the first source/drain region 1001 (seen in FIG. 10A by the dashed lines) of the TFET.

In an embodiment the fifth dopants may be implanted into the first implantation region 1002 using a process such as a fifth implantation process (represented in FIG. 10B by the arrows labeled 1005), whereby ions of the desired fifth dopants are accelerated and directed towards the middle section 110 of the fin 103 to form the first implantation region 1002. The fifth implantation process 1005 may utilize an accelerator system to accelerate ions of the desired fifth dopant with an energy of from about 0.5 KeV to about 30 KeV, such as about 2 KeV. Additionally, in order to form the first implantation region 1002 within the middle section 110 of the fin 103 and not to implant the fifth dopants throughout the middle section 110 of the fin 103, the fifth dopants are implanted at, e.g., a third angle $\alpha_3$ of between about 1° and about 90°, such as about 45°, from perpendicular to the semiconductor substrate 101.

Using the fifth implantation process 1005, the first implantation region 1002 may be formed with a fourth width $W_4$ within the fin 103 of between about 2 nm and about 50 nm, such as about 5 nm. Additionally, the fifth dopants may be implanted to a concentration of between about 1e13 cm$^{-3}$ to about 1e17 cm$^{-3}$, such as about 1e16 cm$^{-3}$. However, any desired dimensions and concentrations may alternatively be utilized.

The second implantation region 1004 may be formed by implanting the middle section 110 of the fin 103 with sixth dopants that are similar to the fourth dopants that were previously implanted into the fourth section 108 of the fin 103 (see FIGS. 6A-6B). Together, the second implantation region 1004 (within the middle section 110 of the fin 103) and the fourth section 108 (which may be seen as a second extension region extending away from the second implantation region 1004) form the second source/drain region 1003 (seen in FIG. 10A by the dashed lines) of the TFET. The second implantation region 1004 may be formed using a sixth implantation process (represented in FIG. 10B by the arrows labeled 1007). In an embodiment the sixth implantation process 1007 may be ion implantation process, whereby ions of the desired sixth dopants are accelerated and directed towards the middle section 110 of the fin 103. The sixth implantation process 1007 may utilize an accelerator system to accelerate ions of the desired sixth dopant with an energy of from about 0.5 KeV to about 30 KeV, such as about 2 KeV. Additionally, in order to form the second implantation region 1004 within the fin 103 and not to implant the sixth dopants throughout the middle section of the fin 103 (e.g., within the first implantation region 1002), the sixth dopants are implanted at, e.g., a fourth angle $\alpha_4$ of between about 1° and about 90°, such as about 45° from perpendicular to the semiconductor substrate 101.

By using the sixth implantation process 1007, the second implantation region 1004 may be formed with a fifth width $W_5$ within the fin 103 of between about 2 nm and about 50 nm, such as about 5 nm. Additionally, the sixth dopants may be implanted to a concentration of between about 1e13 cm$^{-3}$ to about 1e17 cm$^{-3}$, such as about 1e16 cm$^{-3}$. However, any suitable dimensions and any suitable concentrations may alternatively be utilized.

However, while precise examples are of the doping concentrations are provided above, these examples are only intended to be illustrative and are not intended to be limiting. Rather, the precise doping levels utilized may involve a trade-off between good electrostatic control from the gate (wherein a lower doping level may be desired, although as a fin is reduced in size a higher doping may be utilized) and higher tunneling efficiency (wherein a higher doping level may be desired).

For example, in a particular embodiment the second implantation region 1004 may be implanted to have a high doping concentration on the source connected side, such as having a doping concentration greater than $10^{19}$/cm$^3$ and have a lower doping concentration on the drain connected side, such as having a doping concentration less than about $10^{17}$/cm$^3$. By modifying the doping concentrations on either side, the performance of the TFET formed from the fin 103 may be tuned.

Figure 11B:
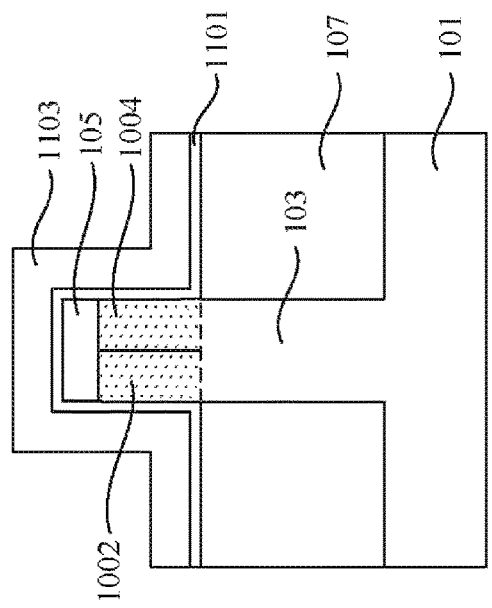
FIGS. 11A-11B illustrate a formation of a gate dielectric and gate electrode in accordance with some embodiments.
Figure 11A:
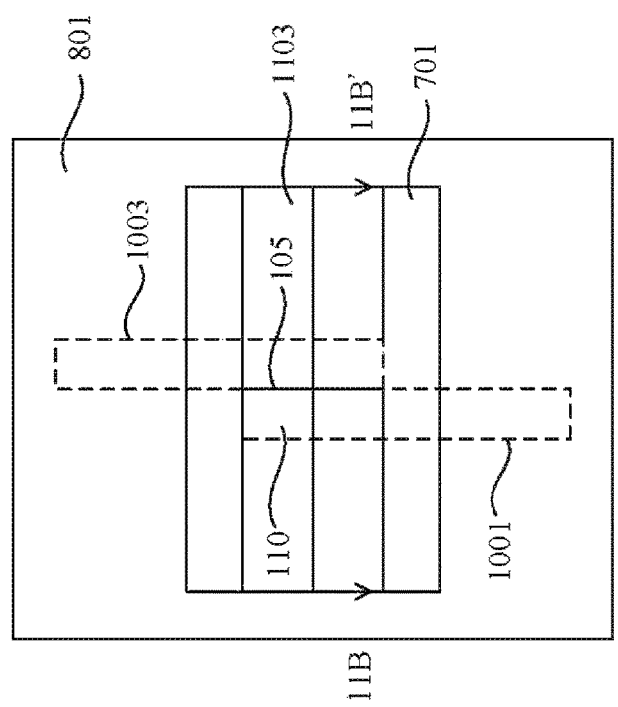

FIGS. 11A-11B (wherein FIG. 11B is a cross-sectional view of FIG. 11A through line 11A-11A') illustrate a formation of a gate dielectric 1101 and a gate electrode 1103 over the fin 103. The gate dielectric 1101 (not visible in FIG. 4A but seen in FIG. 4B) may be formed by thermal oxidation, chemical vapor deposition, sputtering, or any other methods known and used in the art for forming a gate dielectric. The gate dielectric 1101 may comprise a material such as silicon dioxide or silicon oxynitride with a thickness ranging from about 3 angstroms to about 100 angstroms, such as about 10 angstroms. The gate dielectric 1101 may alternatively be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the gate dielectric 1101.

The gate electrode 1103 may comprise a conductive material and may be selected from a group comprising of polycrystalline-silicon (poly-Si), poly-crystalline silicon-germanium (poly-SiGe), metallic nitrides, metallic silicides, metallic oxides, metals, combinations of these, and the like. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, etc.

The gate electrode 1103 may be deposited by chemical vapor deposition (CVD), sputter deposition, or other techniques known and used in the art for depositing conductive materials. The thickness of the gate electrode 1103 may be in the range of about 200 angstroms to about 4,000 angstroms. Ions, if desired, may or may not be introduced into the gate electrode 1103 at this point.

Figure 12B:
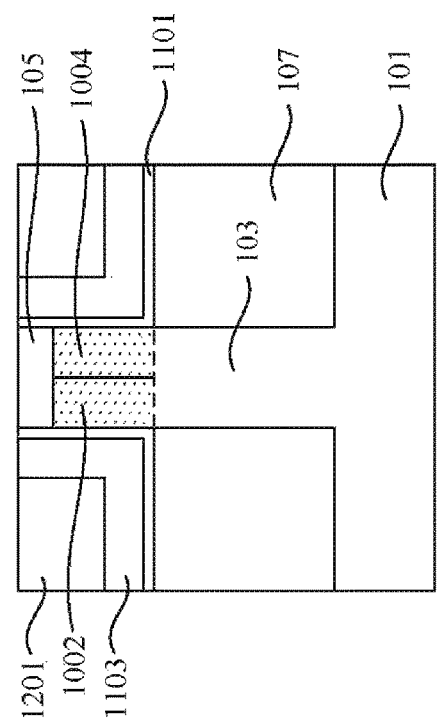
FIGS. 12A-12B illustrate a planarization process in accordance with some embodiments.
Figure 12A:
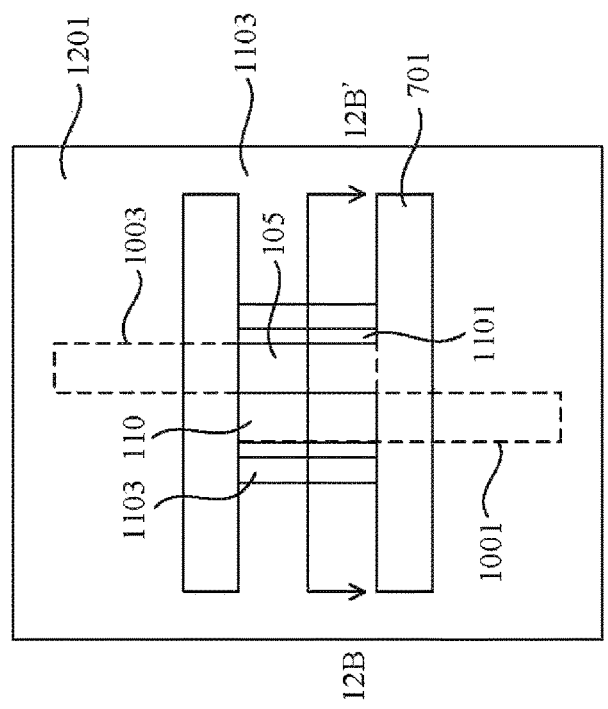

FIGS. 12A-12B (wherein FIG. 12B is a cross-sectional view of FIG. 12A through line 12A-12A') illustrate a deposition of a second ILD 1201 over the gate electrode 1103. In an embodiment the second ILD 1201 may be formed by ALD, PVD, CVD, or other acceptable methods for forming an ILD. The second ILD 1201 may comprise doped or undoped silicon oxide, although other materials such as silicon nitride doped silicate glass, high-k materials, combinations of these, or the like, may alternatively be utilized. The second ILD 1201 may be deposited in order to cover the gate electrode 1103.

FIGS. 12A-12B also illustrate that, once the second ILD 1201 has been deposited, a planarization process is performed in order to remove excess material from the second ILD 1201, the gate electrode 1103, and the gate dielectric 1101. In an embodiment the planarization process may be a chemical mechanical polishing (CMP) process, in which chemicals and abrasives are utilized to react and grind the material of the second ILD 1201, the gate electrode 1103, and the gate dielectric 1101 from over the fin 103 (while leaving at least a portion of the patterned mask 105) and planarize the gate electrode 1103 with the spacers 701 and the second ILD 1201. However, any suitable planarization process may alternatively be utilized.

Figure 13:
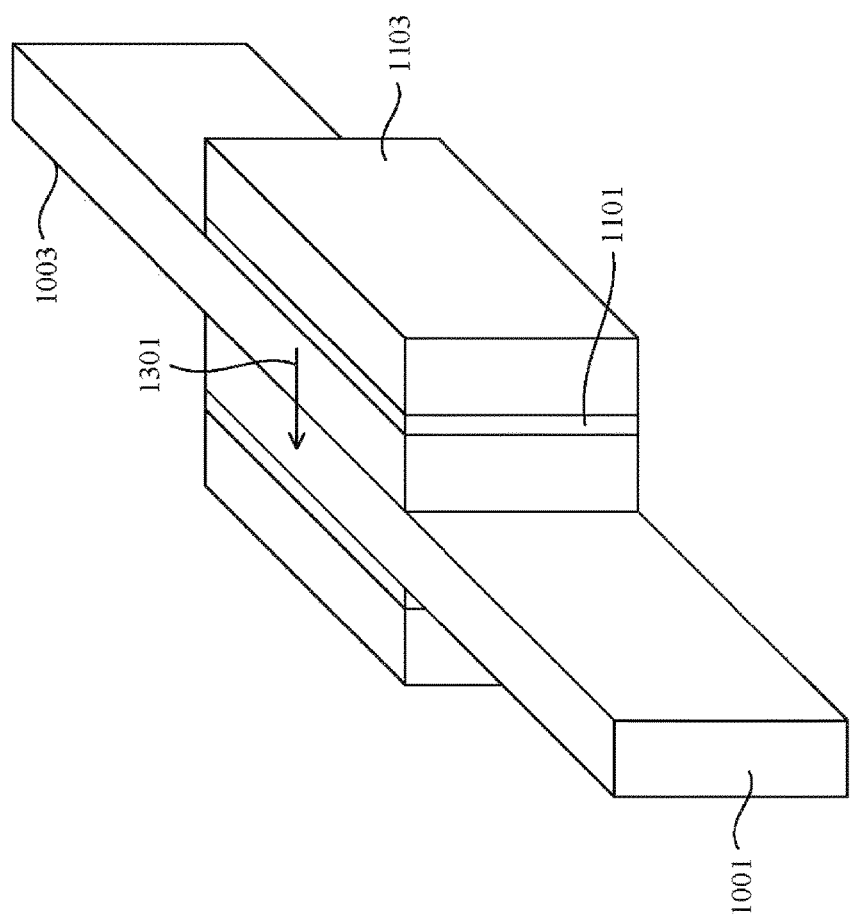
FIG. 13 illustrates a tunnel field effect transistor in accordance with some embodiments.

FIG. 13 illustrates a three-dimensional view of the first source/drain region 1001, the second source/drain region 1003, the gate dielectric 1101, and the gate electrode 1103, with the semiconductor substrate 101, the isolation regions 107, the first ILD 801, the spacers 701, and the second ILD 1201 removed for convenience. As can be seen, in this embodiment the tunneling of the TFET will occur laterally in a direction perpendicular parallel with the semiconductor substrate 101 (as represented in FIG. 13 by the arrow labeled 1301). As such, the overlap size of the TFET (the overlap between the first source/drain region 1001 and the second source/drain region 1003) may be increased by simply increasing the height of the fin 103 and with no subsequent increase in the overall cell area.

Additionally, by using the processes described herein, the TFET may be formed using finFET processes and, as such, may be incorporated into compatible finFET processes. Also, these processes disclosed herein are self-aligning processes, and use both the first dummy gate material 109 along with the first implantation mask 021 and the second implantation mask 501 so that the precision that is desired from the photoresist may be reduced.

Figure 14B:
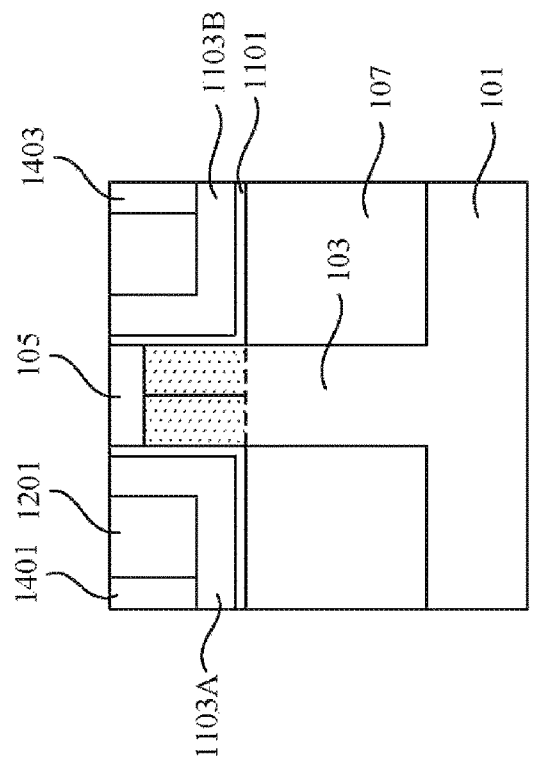
FIGS. 14A-14B illustrate a formation of contacts to the gate electrode in accordance with some embodiments.
Figure 14A:
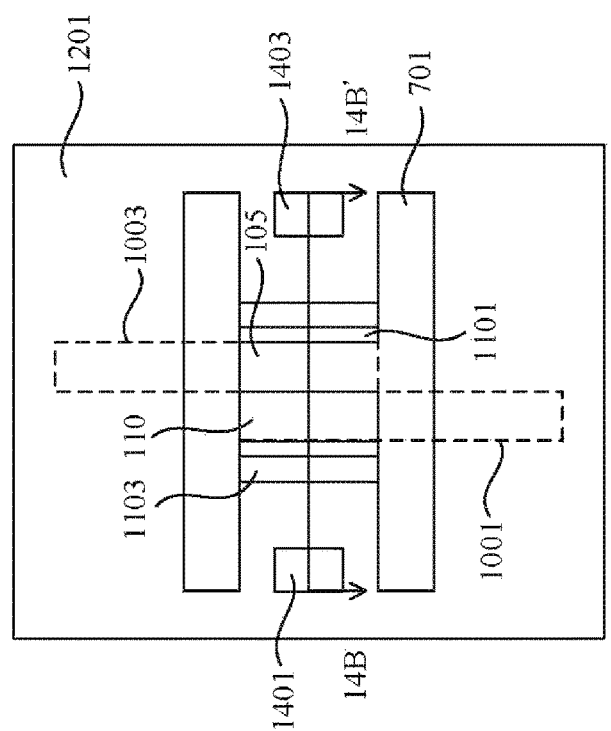

FIGS. 14A-14B (wherein FIG. 14B is a cross-sectional view of FIG. 14A through line 14B-14B') illustrate a formation of a first contact 1401 in electrical connection with a first section 1103A of the gate electrode 1103 and a second contact 1403 in electrical connection with a second section 1103B of the gate electrode 1103. In an embodiment the first contact 1401 and the second contact 1403 may be formed by initially forming contact openings (not separately illustrated) through the second ILD 1201 in order to expose the first section 1103A of the gate electrode 1103 and the second section 1103B of the gate electrode 1103. The contact openings may be formed, for example, using a photolithographic masking and etching process.

Once the contact openings have been formed, the contact openings may be filled with a barrier layer and a conductive material (not separately labeled in FIGS. 14A-14B). In an embodiment, the barrier layer may be formed of one or more layers of titanium, titanium nitride, tantalum, tantalum nitride, tungsten nitride, ruthenium, rhodium, platinum, other noble metals, other refractory metals, their nitrides, combinations of these, or the like. The barrier layer may be formed through chemical vapor deposition, although other techniques such as PVD or ALD could alternatively be used. The barrier layer may be formed to a thickness of about 5 Å to about 500 Å.

After the barrier layer has been formed, the conductive material may be formed to fill the contact openings. The conductive material may be formed be initially forming a seed layer (also not individually shown in FIGS. 14A-14B) over the barrier layer. The seed layer may be deposited by PVD, ALD or CVD, and may be formed of tungsten, copper, or copper alloys, although other suitable methods and materials may alternatively be used if desired. Additionally, while the thickness of the seed layer will be dependent at least in part on the depth of the contact openings, the seed layer may have a thickness of between about 5 Å and about 1,000 Å.

Once the seed layer has been formed, the conductive material may be formed onto the seed layer. The conductive material may comprise tungsten, although other suitable materials such as aluminum, copper, tungsten nitride, ruthenium, silver, gold, rhodium, molybdenum, nickel, cobalt, cadmium, zinc, alloys of these, combinations thereof, and the like, may alternatively be utilized. The conductive material may be formed by electroplating the conductive material onto the seed layer, filling and overfilling the contact openings.

Once the contact openings have been filled, excess barrier layer, seed layer, and conductive material outside of the contact openings may be removed through a planarization process such as chemical mechanical polishing (CMP), although any suitable removal process may be used. The planarization process will also planarize the first contact 1401 and the second contact 1403 with the second ILD 1201, the first section 1103A of the gate electrode 1103, the second section 1103B of the gate electrode 1103, and the gate dielectric 1101.

FIGS. 15A-15B (wherein FIG. 15B is a cross-sectional view of FIG. 15A through line 15B-15B') illustrate another embodiment in which the fifth implantation process 1005 and the sixth implantation process 1007 are not performed, thereby leaving the middle section 110 of the fin 103 with only those dopants, if any, that were present when the fin was initially formed. In this embodiment, the first source/drain region 1001 comprises only the second section 104 of the fin 103 (that had been doped using the second implantation process 403 (see FIGS. 4A-4B)) and the second source/drain region 1003 comprises only the fourth section 108 of the fin 103 (that had been doped using the fourth implantation process 603 (see FIGS. 6A-6B)).

In this embodiment, the TFET will still operate if two different gate voltages are applied to the first section 1103A of the gate electrode 1103 and to the second section 1103B of the gate electrode 1103. For example, if a first voltage (to create an electrostatic doping) of between about −15V and about +15V, such as about +/−1V is applied to the first section 1103A of the gate electrode 1103 and a second voltage (to bias the transistor) of between about −1V and about +1V, such as about +/−0.5V, is applied to the second section 1103A of the gate electrode 1103, the TFET may be switched even without the doping immediately adjacent to the gate electrode 1103.

FIGS. 16A-16B (wherein FIG. 16B is a cross-sectional view of FIG. 16A along line 16B-16B') illustrates another embodiment in which the fin 103 is formed from a first material 1601 and a second material 1603 with a different etch resistivity than the first material 1601. In an embodiment the first material 1601 may comprise, e.g., a III-V material that has already been doped with n-type dopants, while the second material 1603 may be, e.g., a III-V material that has already been doped with p-type dopants.

In an embodiment the first material 1601 may be formed by initially placing and patterning a photoresist in order to expose only the portions of the semiconductor substrate 101 that will become the first material 1601 and then using a seventh implantation process (not separately illustrated) in order to implant the n-type dopants into the semiconductor substrate 101 to form the first material 1601. Once the first material 1601 has been formed, the second material 1603 may be formed by placing and patterning another photoresist in order to cover the first material 1601 and expose the portions of the semiconductor substrate 101 that will become the second material 1603 and then using an eight implantation process (also not separately illustrated) in order to implant the p-type dopants into the semiconductor substrate 101. Once the first material 1601 and the second material 1603 have been formed, the fin 103 may be patterned such that the first material 1601 makes up the second section 104 and the third section 106 of the fin 103 and the second material 1603 makes up the first section 102 and the fourth section 108 of the fin 103.

However, the above described process for forming the first material 1601 and the second material 1603 is intended to be illustrative and is not intended to limiting. Rather, any suitable process for forming the first material 1601 and the second material 1603, such as performing a series of epitaxial growths that grows the first material 1601 separately from the second material 1603, may alternatively be used. All such processes are fully intended to be included within the scope of the embodiments.

FIGS. 17A-17B (wherein FIG. 17B is a cross-sectional view of FIG. 17A through line 17B-17B') illustrates a removal of the first section 102 of the fin 103. In an embodiment, because the second material 1603 has a different etch selectivity than the first material 1601, the removal of first section 102 may be performed without the first implantation process 203. As such, the removal of the first section 102 may be performed by placing the first implantation mask 201 and then selectively removing the first section 102 without significantly removing the second section 104 using, e.g., a wet etch process. In an embodiment in which the first material 1601 is SiGe and the second material 1603 is Ge, the etchant used may be HCl.

Figure 18B:
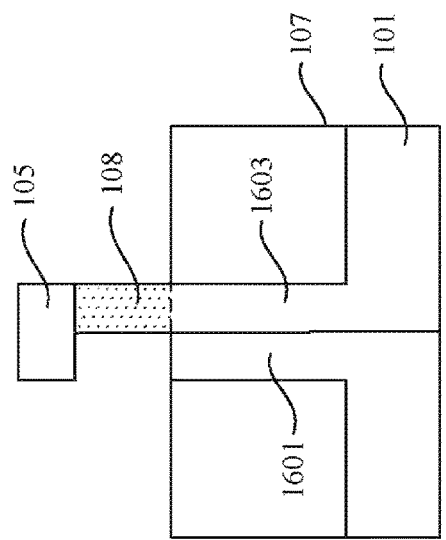
FIGS. 18A-18B illustrate a removal of the second section in accordance with some embodiments.
Figure 18A:
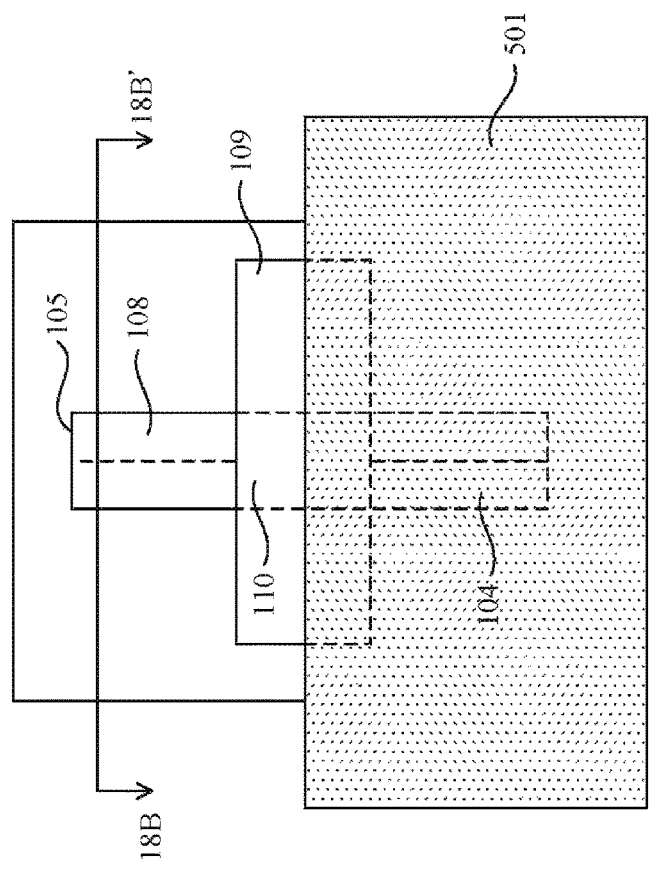

FIGS. 18A-18B (wherein FIG. 18B is a cross-sectional view of FIG. 18A through line 18B-18B') illustrate a removal of the third section 106 of the fin 103. In an embodiment, because the first material 1601 has a different etch selectivity than second material 1603, the removal of the third section 106 may be performed without the third implantation process 503. As such, the removal of the third section 106 may be performed by placing the second implantation mask 501 and then selectively removing the third section 106 without significantly removing the fourth section 108 using, e.g., a wet etch process. In an embodiment in which the first material 1601 is SiGe and the second material 1603 is Ge, the etchant used may be a mixture of ammonia hydroxide, hydrogen peroxide, and water (e.g., in a 0.25:1:5 ratio), such as an APM clean mixture.

By using the first material 1601 and the second material 1603, the remainder of the steps as described above may be used to form the TFET without requiring the amorphizing implantations in order to adjust the selectivity of the first section 102 and the third section 106, while the remainder of the steps (such as replacing the first dummy gate material 109) may be performed as described above. As such, the amorphizing implantation steps may be avoided. Such a reduction in the number of process steps helps to make the overall process more efficient.

One embodiment is a semiconductor device. The semiconductor device includes a semiconductor substrate having a fin which has a middle fin section, a first fin section which extends along a first sidewall of the middle fin section in a first direction, and a second fin section which extends along a second sidewall of the middle fin section in a second direction opposite the first direction. The first fin section has a first width and the middle fin section has a second width greater than the first width.

Another embodiment is semiconductor device which includes a first section, second section, and third section. The first section has a first width between a first sidewall and a second sidewall. The first section has a first conductivity. The second section has a second width between a third sidewall and a fourth sidewall. The third section of the semiconductor fin has a third width between a fifth sidewall and a sixth sidewall. The third section has a second conductivity opposite to the first conductivity. The first section extends from the second section and the first sidewall is coplanar with the third sidewall. The third section extends from the second section in an opposite direction from the first section, wherein the fifth sidewall is coplanar with the fourth sidewall. The second width is greater than the first width and the third width.

Another embodiment is semiconductor device which includes a semiconductor middle fin section with a first width over a substrate. First dopants of a first conductivity are included within a first portion of the semiconductor middle fin section. Second dopants of a second conductivity opposite the first conductivity are also within a second portion of the semiconductor middle fin section, wherein the first portion and the second portion are in physical contact with each other. A first extension region in is in physical contact with the first portion and extends away from the semiconductor middle fin section. The first extension region has a second width less than the first width. Third dopants of the first conductivity are within the first extension region. A second extension region is in physical contact with the second portion and extends in an opposite direction than the first extension region. The second extension region has a third width less than the first width. Fourth dopants of the second conductivity are within the second extension region.

In accordance with an embodiment, a method of manufacturing a semiconductor device comprising forming a fin from a semiconductor substrate is provided. A first section is removed from a first corner region of the fin and a second section is removed from a second corner region of the fin, wherein the second section is on an opposite side of the fin from the first section. First dopants are implanted to form a first source/drain region within the fin, and second dopants are implanted to form a second source/drain region within the fin in physical contact with the first source/drain region, wherein the second source/drain region has an opposite conductivity than the first source/drain region.

In accordance with another embodiment, a method of manufacturing a semiconductor device comprising patterning a fin from a semiconductor substrate using a patterned mask is provided. The fin comprises a middle section, a first portion and a second portion on a first side of the middle section, and a third portion and a fourth portion on a second side of the middle section opposite the first side, wherein the first portion, the middle section, and the fourth portion share a side of the fin. First ions are implanted into the first portion, and the first portion is removed. Second ions are implanted into the third portion, and the third portion is removed. Third ions and fourth ions are implanted into the middle section, wherein the third ions have a first conductivity and the fourth ions have a second conductivity different from the first conductivity. A gate electrode is formed adjacent to the middle section.

In accordance with yet another embodiment, a semiconductor device comprising a semiconductor middle fin section with a first width over a substrate is provided. First dopants of a first conductivity are within a first portion of the semiconductor middle fin section. Second dopants of a second conductivity opposite the first conductivity are within a second portion of the semiconductor middle fin section, wherein the first portion and the second portion are in physical contact with each other. A first extension region is in physical contact with the first portion and extending away from the semiconductor middle fin section, wherein the first extension region has a second width less than the first width. Third dopants of the first conductivity are within the first extension region. A second extension region is in physical contact with the second portion and extending in an opposite direction than the first extension region, wherein the second extension region has a third width less than the first width. Fourth dopants of the second conductivity are within the second extension region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
 a semiconductor substrate having a fin, the fin comprising:
  a lower fin portion, wherein the lower fin portion has a rectangular shape in plan view, and
  an upper fin portion, wherein the upper fin portion comprises a middle fin section, a first fin section extending along a first sidewall of the middle fin section in a first direction, and a second fin section extending along a second sidewall of the middle fin section in a second direction opposite the first direction, and
  wherein the first fin section has a first width and the middle fin section has a second width greater than the first width, the second width being from the first sidewall to the second sidewall, and wherein the first sidewall of the middle fin section and the second sidewall of the middle fin section each extend vertically from the semiconductor substrate, wherein the first fin section and second fin section each extend vertically from the lower fin portion;
 a first dopant of a first conductivity, wherein the first dopant is within the first fin section; and
 a second dopant of a second conductivity, wherein the second dopant is within the second fin section.

2. The semiconductor device of claim 1, wherein the first dopant is within the first sidewall of the middle fin section and the second dopant is within the second sidewall of the middle fin section.

3. The semiconductor device of claim 2, wherein the second conductivity is opposite the first conductivity.

4. The semiconductor device of claim 1, wherein:
 a top surface of the first fin section, a top surface of the second fin section, and a top surface of the middle fin section are all level.

5. The semiconductor device of claim 1, wherein the second width of the middle fin section is twice the first width of the first fin section.

6. The semiconductor device of claim 1, further comprising:
 a gate structure formed over the middle fin section, the gate structure not being formed over the first fin section or the second fin section.

7. The semiconductor device of claim 6, wherein the gate structure comprises:
 a gate dielectric in contact with the middle fin section; and
 a gate electrode over the gate dielectric.

8. A semiconductor device, comprising:
 a base section of a semiconductor fin, the base section being rectangular in plan view;
 a first section of a semiconductor fin on the base section, the first section having a first width between a first sidewall and a second sidewall, the first section having a first conductivity;
 a second section of the semiconductor fin on the base section, the second section having a second width between a third sidewall and a fourth sidewall; and
 a third section of the semiconductor fin on the base section, the third section having a third width between a fifth sidewall and a sixth sidewall, the third section having a second conductivity opposite to the first conductivity, and
 wherein the first section extends from the second section and the first sidewall is aligned with the third sidewall, wherein the third section extends from the second section in an opposite direction from the first section, wherein the fifth sidewall is aligned with the fourth sidewall, wherein the second width is greater than the first width and the third width, wherein the first sidewall and third sidewall are aligned with a first sidewall of the base section, wherein the fourth sidewall and fifth sidewall are aligned with a second sidewall of the base section, and wherein the second sidewall and the sixth sidewall abut a top surface of the base section.

9. The semiconductor device of claim 8, wherein the second section comprises a first portion adjacent to the first section and a second portion adjacent to the third section, wherein the first portion has the first conductivity, and wherein the second portion has the second conductivity.

10. The semiconductor device of claim 9, wherein the first conductivity is associated with a first dopant, and the second conductivity is associated with a second dopant, wherein a concentration of the first dopant in the first section is greater than a concentration of the first dopant in the second section.

11. The semiconductor device of claim 10, wherein a concentration of the second dopant in third section is greater than a concentration of the second dopant in the second section.

12. The semiconductor device of claim 8, wherein the second sidewall is perpendicular to an adjacent end wall of the second section.

13. The semiconductor device of claim 8, further comprising:
 a gate dielectric over the third sidewall of the second section; and
 a gate electrode over the gate dielectric.

14. The semiconductor device of claim 8, wherein the second section comprises a III-V material.

15. A semiconductor device comprising:
a semiconductor base fin section surrounded by a dielectric material, the semiconductor base fin section having two lengthwise parallel sidewalls which extend from one end of the semiconductor base fin section to an opposite end of the semiconductor base fin section;
a semiconductor middle fin section with a first width over a substrate, the semiconductor middle fin section disposed over the semiconductor base fin section, wherein sidewalls of the semiconductor middle fin section extend from the sidewalls of the semiconductor base fin section;
first dopants of a first conductivity within a first portion of the semiconductor middle fin section;
second dopants of a second conductivity opposite the first conductivity within a second portion of the semiconductor middle fin section, wherein the first portion and the second portion are in physical contact with each other;
a first extension region disposed over the semiconductor base fin section, the first extension region in physical contact with the first portion and extending away from the semiconductor middle fin section, wherein the first extension region has a second width less than the first width;
third dopants of the first conductivity within the first extension region;
a second extension region disposed over the semiconductor base fin section, the second extension region in physical contact with the second portion and extending in an opposite direction than the first extension region, wherein the second extension region has a third width less than the first width; and
fourth dopants of the second conductivity within the second extension region.

16. The semiconductor device of claim 15, wherein a concentration of first dopants in the first extension region is greater than a concentration of first dopants in the semiconductor middle fin section.

17. The semiconductor device of claim 15, further comprising:
a gate dielectric adjacent to the semiconductor middle fin section; and
a gate electrode adjacent to the gate dielectric.

18. The semiconductor device of claim 17, wherein the semiconductor middle fin section extends a first distance away from the substrate, and wherein the gate electrode extends no further than the semiconductor middle fin section.

19. The semiconductor device of claim 17, further comprising a dielectric material over the substrate, wherein the dielectric material, the gate electrode, and the semiconductor middle fin section are planar with each other.

20. The semiconductor device of claim 15, wherein the semiconductor middle fin section comprises a III-V material.

* * * * *